US012512252B2

(12) United States Patent
Yun et al.

(10) Patent No.: US 12,512,252 B2
(45) Date of Patent: Dec. 30, 2025

(54) MONOLITHIC OR MULTI-DIE INTEGRATED CIRCUIT TRANSFORMER

(71) Applicant: Analog Devices, Inc., Wilmington, MA (US)

(72) Inventors: Ruida Yun, Weston, MA (US); Dongwan Ha, Arlington, MA (US); Baoxing Chen, Westford, MA (US)

(73) Assignee: Analog Devices, Inc., Wilmington, MA (US)

( * ) Notice: Subject to any disclaimer, the term of this patent is extended or adjusted under 35 U.S.C. 154(b) by 791 days.

(21) Appl. No.: 17/841,146

(22) Filed: Jun. 15, 2022

(65) Prior Publication Data

US 2023/0411065 A1 Dec. 21, 2023

(51) Int. Cl.
*H01F 27/29* (2006.01)
*H01F 27/28* (2006.01)
(Continued)

(52) U.S. Cl.
CPC ..... *H01F 27/2804* (2013.01); *H01F 27/2885* (2013.01); *H01F 27/29* (2013.01);
(Continued)

(58) Field of Classification Search
CPC .. H01F 27/2804; H01F 27/2885; H01F 27/29; H01F 27/40; H01F 2027/2809; H01F 2019/085; H01F 19/08; H10D 1/20
(Continued)

(56) References Cited

U.S. PATENT DOCUMENTS 7,526,256 B2 * 4/2009 Bhatti .................... H04B 1/006 455/73
8,552,821 B2 * 10/2013 Nagai .................. H01P 1/2013 310/320

(Continued)

FOREIGN PATENT DOCUMENTS

CN 117238634 12/2023
DE 102023114970 12/2023

(Continued)

OTHER PUBLICATIONS

"Japanese Application Serial No. 2023-98013, Notification of Reasons for Refusal mailed Apr. 22, 2025", w/ English Translation, 11 pgs.

(Continued)

*Primary Examiner* — Tuyen T Nguyen
(74) *Attorney, Agent, or Firm* — Schwegman Lundberg & Woessner, P.A.

(57) ABSTRACT

A fully symmetrical and balanced monolithic or multi-die integrated circuit transformer device is described. The device can comprise a first and second transformer. The first and second transformer can each comprise a symmetrical bottom coil including electrically conductive crossovers between individual windings of pairs of adjacent windings. Each of the bottom coils can further comprise a first, a second differential terminal, and a center tap third terminal electrically connected to the inner-most winding of the bottom coil. Each transformer can further comprise a spiral top coil electrically connected to an encompassed inner pad and a laterally offset outer pad, the top coil, inner pad, and outer pad including a shared electrically conductive integrated circuit layer. The respective top coils of each transformer can be overlaid and separated from the respective bottom coils by an electrically insulating dielectric layer.

20 Claims, 7 Drawing Sheets

(51) Int. Cl.
*H01F 27/40* (2006.01)
*H10D 1/20* (2025.01)

(52) U.S. Cl.
CPC ............... *H01F 27/40* (2013.01); *H10D 1/20* (2025.01); *H01F 2027/2809* (2013.01)

(58) Field of Classification Search
USPC ........................................... 336/83, 200, 232
See application file for complete search history.

(56) References Cited

U.S. PATENT DOCUMENTS

| | | | | |
|---|---|---|---|---|
| 2004/0251978 A1* | 12/2004 | Muramatsu | H03B 5/1228 | 331/117 R |
| 2009/0146770 A1* | 6/2009 | Lee | H01F 17/0006 | 336/200 |
| 2010/0265024 A1* | 10/2010 | Nakashiba | H01L 25/0655 | 336/200 |

FOREIGN PATENT DOCUMENTS

| | | |
|---|---|---|
| JP | 2010016142 | 1/2010 |
| JP | 2017098334 | 6/2017 |
| JP | 2019009158 A | 1/2019 |
| JP | 2021150579 | 9/2021 |
| WO | 2010140297 | 12/2010 |
| WO | WO-2015114758 A1 | 8/2015 |

OTHER PUBLICATIONS

"Japanese Application Serial No. 2023-098013, Response filed Jul. 22, 2025 to Notification of Reasons for Refusal mailed Apr. 22, 2025", w/ English Claims, 16 pgs.
"Japanese Application Serial No. 2023-98013, Examiners Decision of Final Refusal mailed Oct. 21, 2025", w/ English Translation, 9 pgs.

* cited by examiner

MONOLITHIC OR MULTI-DIE INTEGRATED CIRCUIT TRANSFORMER

TECHNICAL FIELD

The present disclosure generally relates to a transformer structure, more specifically to fabrication of a monolithic or multi-die integrated circuit transformer device.

BACKGROUND

Transformers can be used to communicate power or a communication signal across an isolation barrier, for example, to step-up or step-down the line (mains) voltage to a powered device. Isolation transformers can be used to transfer electrical power from an alternating current (AC) source to the powered device while galvanically isolating the powered device from the power source. Isolation is generally used to protect the circuitry of the powered device, as a safety measure, or to reduce transients and harmonics in the electrical signal. For example, isolation is used to protect against electric shock, to suppress electrical noise in sensitive devices, or to transfer power or a communication signal via magnetic coupling, linkage between coils, or via other coupling mechanisms by other circuit elements that are not directly electrically connected across the isolation barrier.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

SUMMARY/OVERVIEW

Figure 1A:
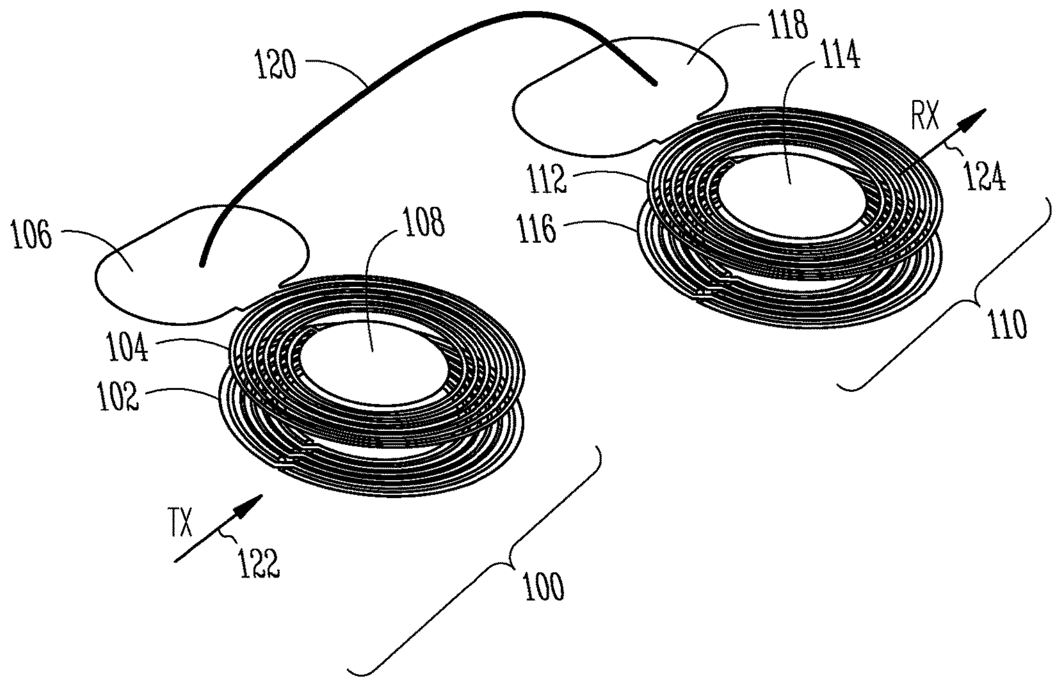
FIGS. 1A and 1B illustrate an example of a balanced and symmetrical pair of transformers in a top view and a cross-sectional view on an integrated circuit die.

On-chip transformers can be important components in many circuits including those involving radiofrequency (RF) wireless communication applications. Some examples of integrated circuits in which on-chip transformers are also included are low-noise amplifiers, voltage-controlled oscillators, impedance matching circuits, direct current (DC) isolation circuits, and power transfer circuits, among others. Isolation transformers can be used to transfer electrical power or a communication signal from an alternating current (AC) source to the powered device while isolating the powered device from the power source. By connecting two transformers in series (back-to-back), the amount of isolation, or stated differently, the isolation performance, can be increased (e.g., doubled).

One possible way to connect transformers in series is to connect two single-spiral coils in series. Such a configuration, however, can cause unwanted radiation emission and/or poor noise immunity (the ability of a device or system to suppress external noise and to function, without deteriorating performance, in the presence of noise).

The radiated emission and noise immunity problems caused by single spirals connected in series can be addressed by connecting two S-shaped coils in series, however, this requires using more silicon, as the S-shaped coils require more silicon area for their fabrication leading to increased material cost. The transformer devices described herein can provide for a fully symmetrical and balanced series-connected (back-to-back) transformers that can help reduce or minimize radiation emission and help provide for increased noise immunity while utilizing a small die size.

A fully symmetrical and balanced monolithic or multi-die integrated circuit transformer device can comprise a first transformer and a second transformer electrically in series with the first transformer. The first transformer can be located on a first integrated circuit die and the second transformer can be located on a second integrated circuit die located adjacent to the first integrated circuit die.

The first transformer can include a symmetrical first bottom coil including electrically conductive crossovers between individual windings of pairs of adjacent windings. The first bottom coil can further include first and second differential terminals and a first center tap third terminal electrically connected to an inner-most winding of the first bottom coil. The first transformer can further include a spiral first top coil electrically connected to an encompassed first inner pad and a laterally offset first outer pad. The first inner pad, the first outer pad, and the first top coil can include a shared first electrically conductive integrated circuit layer. The first top coil and the first bottom coil can be overlaid and separated from each other by an electrically insulating first dielectric layer.

The second transformer can include a symmetrical second bottom coil including electrically conductive crossovers between individual windings of pairs of adjacent windings. The second bottom coil can further include third and fourth differential terminals and a second center tap third terminal electrically connected to an inner-most winding of the second bottom coil. The second transformer can further include a spiral second top coil electrically connected to an encompassed second inner pad and a laterally offset second outer pad. The second inner pad, the second outer pad, and the second top coil can include a shared second electrically conductive integrated circuit layer. The second top coil and the second bottom coil can be overlaid and separated from each other by the electrically insulating first dielectric layer. The bottom coils are symmetrical because the interconnect segments (the differential terminals and the center tap terminal) are formed on a middle axis of the bottom coils in a symmetrical inductor layout, which provides a fully symmetrical and balanced structure, looking into the differential terminals.

The transformer device can further comprise a first ground shield located beneath the first outer pad of the first transformer and a second ground shield located beneath the second outer pad of the second transformer. The first outer pad can be electrically connected to the second inner pad, and the first inner pad can be electrically connected to the second outer pad. In another example, the first outer pad can be electrically connected to the second outer pad and the first inner pad can be electrically connected to the second inner pad.

The transformer device can further comprise a circuit component located below at least one of the first bottom coil or the second bottom coil, or stated another way, under the bottom coil of the first transformer and/or the bottom coil of the second transformer. The circuit component can include a capacitor, an active component included in transmitter circuitry, an active component included in receiver circuitry, a transistor, or any other desired circuit component.

In an example, the top coil of the first transformer can be wound in a clockwise direction and the top coil of the second transformer can be wound in a counter-clockwise direction. The winding directions of the top coils can be based on and cancel the effects of an external magnetic field (e.g., by inducing producing an opposing magnetic field using the current induced by the top coils) and increase noise cancellation efficiency.

A transformer with the layout described herein, namely, a symmetrical bottom coil layout with easy access to the center tap, can reduce or lower radiation emission and increase noise immunity, and uses less silicon area on a circuit die. Placing circuit components (e.g., active circuitry) beneath the coils can further reduce the silicon area, and by placing the transformers in series or in a back-to-back configuration the isolation properties of the transformers can balance even when the top coil has a mismatch between the inner and outer pads.

DETAILED DESCRIPTION

Figure 1B:
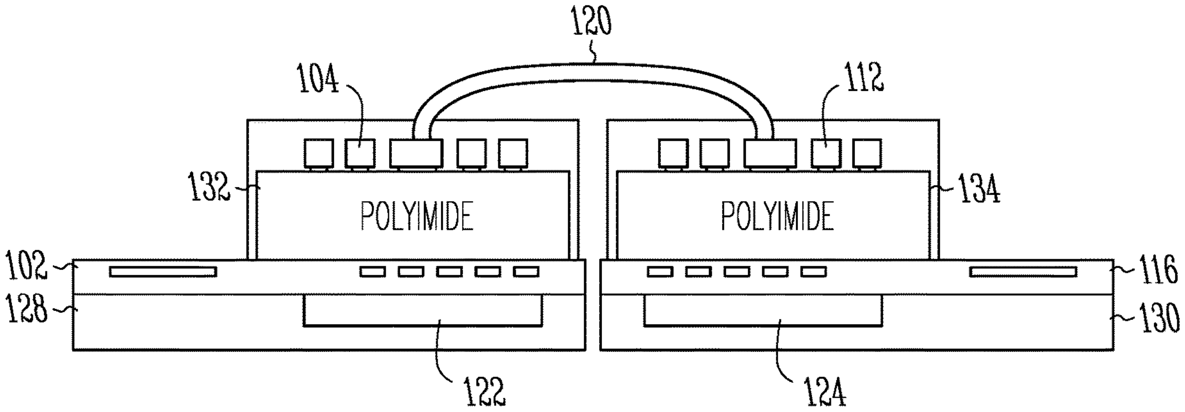

FIGS. 1A and 1B illustrate an example of a balanced and symmetrical pair of transformers in a top view and a cross-sectional view on an integrated circuit die. In the example of FIG. 1A, a first transformer 100, which can include a symmetrical first bottom coil 102 and an aligned overlaying spiral first top coil 104 can be placed electrically in series with a second transformer 110, which can include a symmetrical second bottom coil 116, and an aligned overlaying spiral second top coil 112. The spiral first top coil 104 can include an encompassed first inner pad 108 and a laterally offset first outer pad 106. Similarly, the spiral second top coil 112 can include an encompassed second inner pad 114 and a laterally offset second outer pad 118. The outer pads and inner pads of the top coils can be electrically connected such as using a bond wire 120, connecting the laterally offset first outer pad 106 to the laterally offset second outer pad 118. The outer pads and inner pads of each of the top coils can be connected in any desired configuration. For example, the laterally offset first outer pad 106 can be connected to the encompassed second inner pad 114, in which case the encompassed first inner pad 108 is connected to the laterally offset second outer pad 118. In the example illustrated in FIG. 1A, when the laterally offset first outer pad 106 is connected to the laterally offset second outer pad 118, the encompassed first inner pad 108 is connected to the encompassed second inner pad 114. In an example, a circuit component can be located below one or both of the symmetrical first bottom coil 102 or the symmetrical second bottom coil 116. As illustrated in FIG. 1A, the circuit component can include transmitter circuitry 122 or receiver circuitry 124, which can be connected to terminals of the symmetrical first bottom coil 102 or the symmetrical second bottom coil 116. The circuit component can be any kind of circuit component, whether an active component or a passive component. For example, the circuit component can include a capacitor, a transistor, a diode, a resistor, an inductor, or any component desired.

FIG. 1B illustrates a cross-sectional view of the first transformer 100 and the second transformer 110. In an example, the first transformer 100 can be located on a first integrated circuit die 128 and the second transformer 110 can be located on a different or separate second integrated circuit die 130 such as which can be located adjacent to the first integrated circuit die 128. As further illustrated in FIG. 1B, the spiral first top coil 104 and the symmetrical first bottom coil 102 are overlaid in aligned registration and are separated from each other by an electrically insulating first dielectric layer 132. Similarly, the spiral second top coil 112 and the symmetrical second bottom coil 116 are overlaid in aligned registration and are separated from each other by an electrically insulating second dielectric layer 134. In an example, as shown in FIG. 1B, the electrically insulating first dielectric layer 132 and electrically insulating second dielectric layer 134 can be formed from a polyimide film or resin to act or perform as an insulating and/or passivation layer between the top coils and the bottom coils of the transformers. While a polyimide is used as an example, the dielectric layer between the coils can be formed from any suitable dielectric material, such as a silicon dioxide or silicon nitride dielectric available in a CMOS process or any other suitable material with dielectric insulating properties. In an example, the electrically insulating first dielectric layer 132 and the electrically insulating second dielectric layer 134 can be formed from the same material, or the electrically insulating first dielectric layer 132 can be formed from a first material and the electrically insulating second dielectric layer 134 can be formed from a second material different from the first material. Furthermore, the electrically insulating first dielectric layer 132 and/or the electrically insulating second dielectric layer 134 can include or be made of or formed in several or multiple layers of dielectric material. In such an example, the multiple layers of dielectric material can be formed from different materials. For example, a first layer of the electrically insulating first dielectric layer 132 or the electrically insulating second dielectric layer 134 can be formed from polyimide and a second layer can be formed from a different material such as silicon nitride.

Figure 2B:
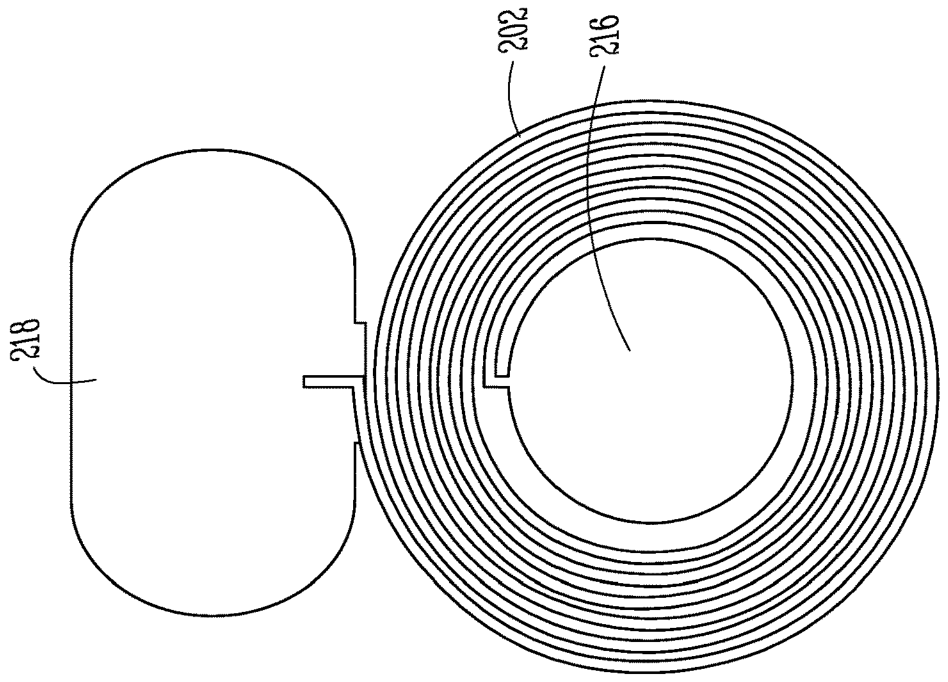
FIGS. 2A and 2B illustrate an example of a detailed view of a bottom coil and a top coil of the transformers of FIGS. 1A and 1B.
Figure 2A:
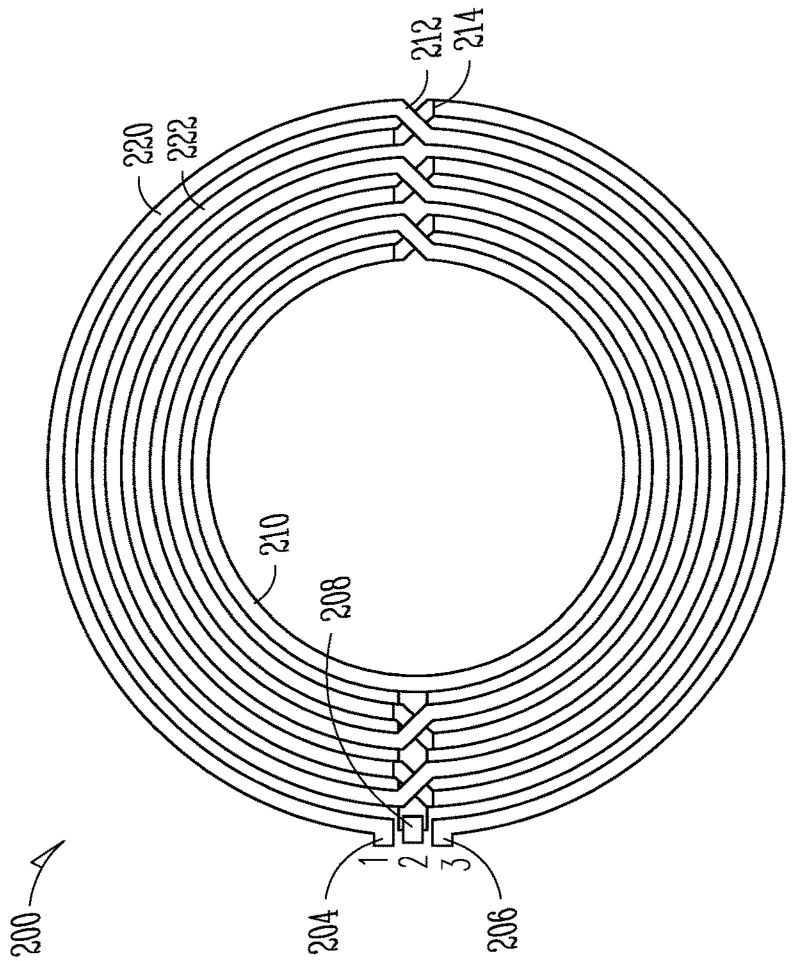

FIGS. 2A and 2B illustrate an example of a detailed view of a bottom coil and a top coil of the transformers of FIGS. 1A and 1B. FIG. 2A illustrates a detailed top view of a bottom coil 200, such as the symmetrical first bottom coil 102 or the symmetrical second bottom coil 116 illustrated in FIG. 1A. In an example, the bottom coil 200 can include electrically conductive crossovers 212 and 214 of individual windings of pairs of adjacent windings. The electrically conductive crossovers 212 and 214 can be formed when a portion of outer winding 220 and its adjacent winding 222 cross each other, are crossed over one another, etc., which can be repeated on other windings of the bottom coil 200 to form additional crossovers. The bottom coil 200 can include multiple terminals, including a first differential terminal 204, and a second differential terminal 206. The bottom coil 200 can include a center tap third terminal 208 that is electrically connected to an inner-most winding 210 of the bottom coil 200. The center tap third terminal 208 can be connected to the inner-most winding with the crossovers connecting adjacent windings but crossing over and separated from the center tap connection. In an example, the bottom coil 200 can be formed using metallization of a complementary metal-oxide semiconductor (CMOS) back-end process (back end of line (BEOL) process), during which layers of metal (e.g., silver, copper, gold, aluminum, or any desirable and/or suitable metals or metal alloys) are used to interconnect wiring, such as with appropriate vias between metallization layers, contacts to underlying devices or structures, or both. In an example, a first metal layer can be used for the electrically conductive crossovers 212, 214, and a second metal layer can be used for underpass to the center tap to connect the center tap third terminal 208 to the inner-most winding 210.

The layout of the bottom coil 200 can provide for balanced (e.g., equivalent) impedances at the first differential terminal 204 and the second differential terminal 206 to provide a robust isolation link, provide increase inductance, increase the magnetic field produced when compared to other isolation transformers, and the center tap connection provides increased noise immunity. This provides an advantage over approaches such as a transformer with an S-shaped coil because a double S-shaped coil would be required to achieve balance and symmetry but takes up much more space on an integrated circuit die than the presently disclosed system. Further, connecting an S-shaped coil to the center tap requires an additional bottom pad which itself necessitates the use of even more of the area of the circuit die. Also, the capacitance between the top coil and the bottom coil in the present disclosure is smaller than the capacitance between coils in an S-shaped transformer, resulting in less in-rush current in the event of voltage changes.

FIG. 2B illustrates a detailed view of a top coil 202, such as spiral first top coil 104 or spiral second top coil 112 discussed for FIGS. 1A and 1B. In an example, the top coil 202 can be a single spiral coil (e.g., a single layer coil) formed from a metal such as gold and can include an inner pad 216 and an outer pad 218. In an example, the inner pad 216 and the outer pad 218 can be asymmetrical (e.g., differently sized, or differently shaped) such as to help accommodate different parasitic properties (stray inductance, winding resistance, coupling capacitance, winding capacitance, or the like) which can cause current spikes or otherwise cause the transformers to deviate from their ideal performance. The asymmetrical shape can aid in meeting assembly requirements aid in the reliability of a connection between a bondwire and the bond-pad (e.g., the inner pad 216 and/or the outer pad 218).

Figure 3:
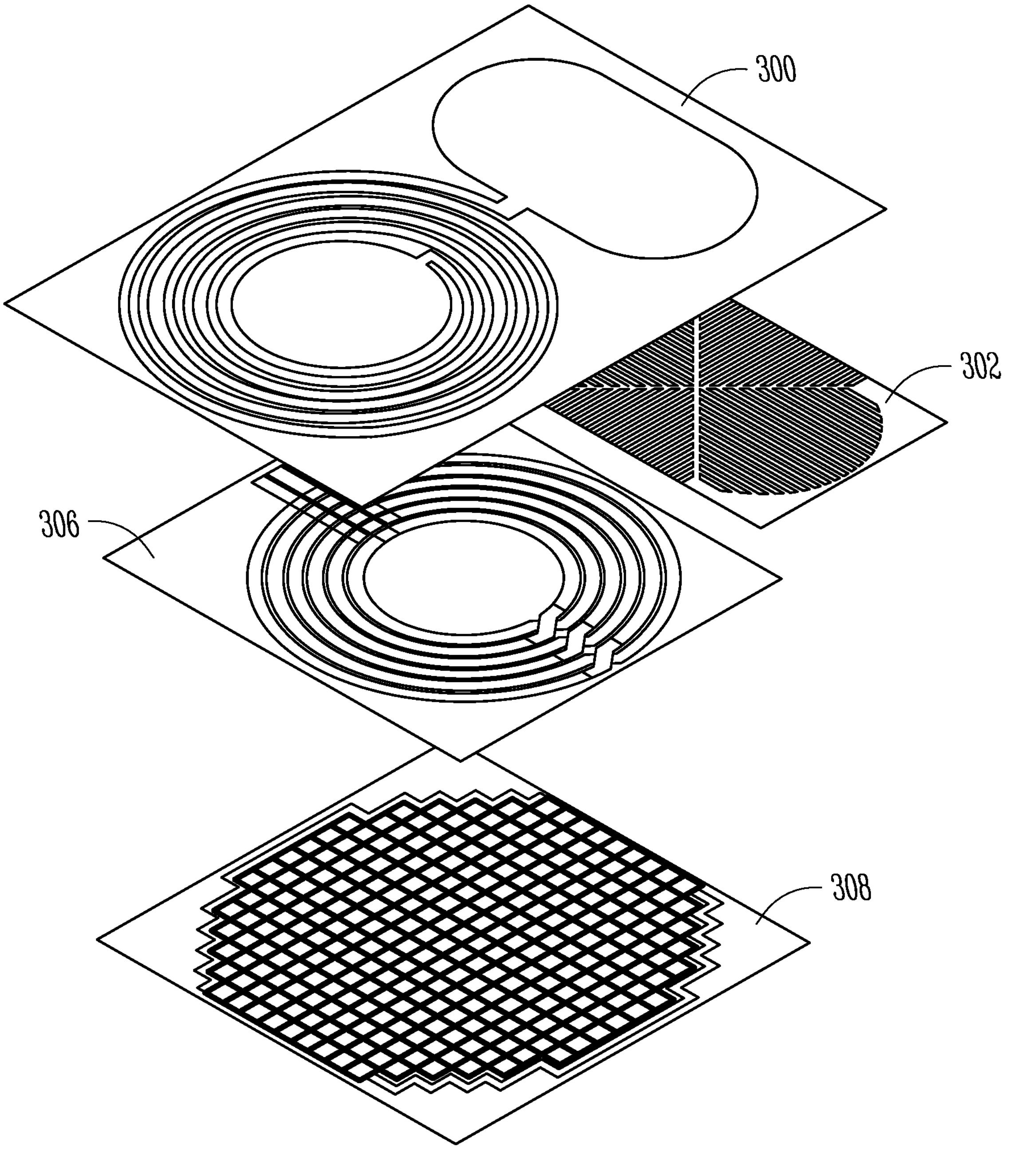
FIG. 3 illustrates an example of individual layers of the transformer devices of FIGS. 1A and 1B.

FIG. 3 illustrates an example of individual layers of the transformer devices of FIGS. 1A and 1B. FIG. 3 illustrates a first integrated circuit layer 300 including a top coil such as the top coils described above in FIGS. 1A, 1B, and 2B. Below or beneath at least a portion of the first integrated circuit layer 300, a second integrated circuit layer 306 (or group of layers) on which a bottom coil, such as the bottom coils discussed in FIGS. 1A, 1B, and 2A can be included. As stated above, the bottom coil can be produced using a (CMOS) back-end process (back end of line (BEOL) process), during which layers of metal (e.g., silver, copper, gold, aluminum, or any desirable and/or suitable metals or metal alloys) are used to form a top surface of the coil, the crossovers, and the center-tap underpass. For example, the top surface can be a third metal layer, the crossover can be a second metal layer, and the underpass connecting the center tap (e.g., connecting the center tap third terminal 208) to the inner-most winding of the bottom coil such as the inner-most winding 210 illustrated in FIG. 2A, can be a first metal layer. In an example, the layers can be formed from the same metal (e.g., all copper, all silver etc.), or each layer can be formed from a different metal.

The transformer device can further include a ground shield 302 located beneath the outer pad of the top coil. The ground shield 302 can be another metal layer (e.g., a fourth layer) that electrically connects to ground to shield the overlaid pad such as to protect it or other components of the transformer or circuitry connected to the transformer from excess current, voltage spikes, noise, or the like. The transformer device can further include a third integrated circuit layer 308 such as a well or other diffusion or other like integrated circuit region, such as optionally including or containing a circuit component. The circuit component can be an active component or a passive component. In an example, the circuit component can be a capacitor, such as an N-well capacitor, a transistor, a diode, an inductor, an active component included in transmitter circuitry, an active component included in receiver circuitry, or any circuit component desired based, for example, on the circuit in which the transformer device is to be included or connected to.

Figure 4:
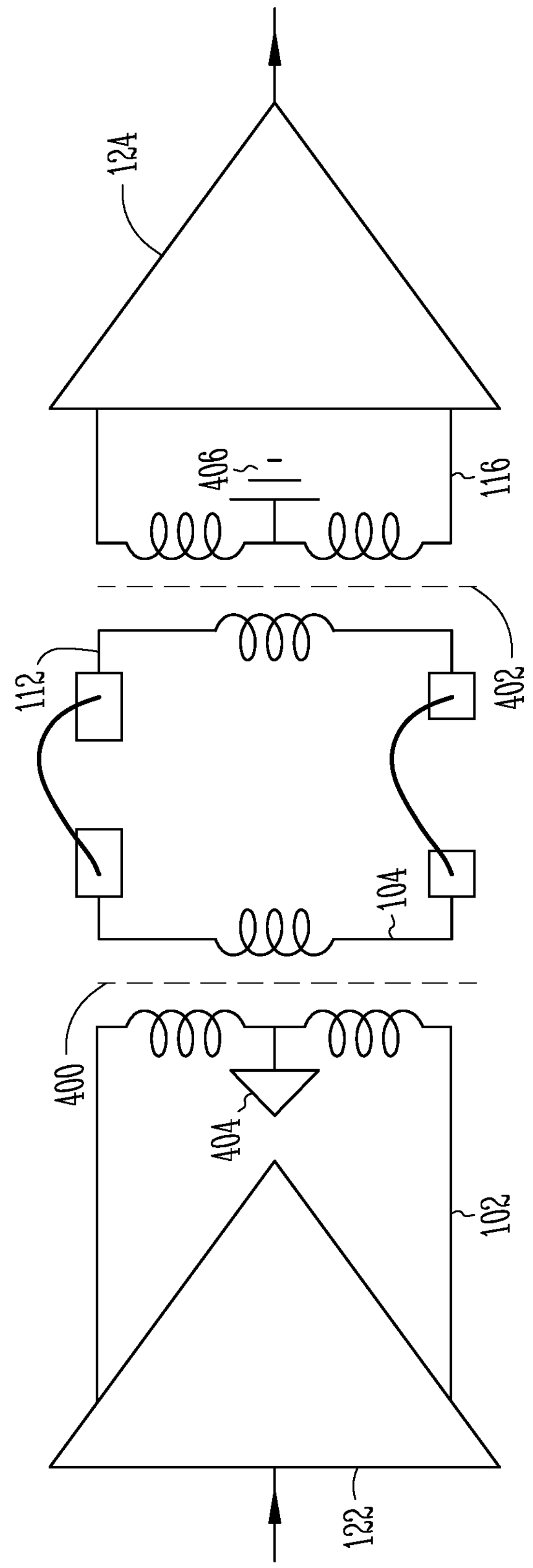
FIG. 4 illustrates an example of a circuit diagram illustrating transmitter circuitry and receiver circuitry connected to series connected transformers.

FIG. 4 illustrates an example of a circuit diagram illustrating transmitter circuitry and receiver circuitry connected to series connected transformers. The circuitry can be an on-off keying (OOK) transmitter or receiver circuitry or a radiofrequency (RF) transmitter or receiver circuitry, or any desired circuitry. As illustrated in the circuit schematic of FIG. 4, the transmitter circuitry 122 can be connected to the symmetrical first bottom coil 102 and the receiver circuitry 124 can be connected to the symmetrical second bottom coil 116. The transmitter circuitry 122 and the receiver circuitry 124 can be replaced with or augmented by any circuit component and need not be limited to a transmitter or a receiver (or components of transmitter or receiver circuitry). FIG. 4 also illustrates that the spiral first top coil 104 and the symmetrical second bottom coil 116 can be electrically connected to each other such as through bond wires. The symmetrical first bottom coil 102 and the symmetrical second bottom coil 116 can allow for easy connection to the center tap 404 and 406 of each transformer (which corresponds the center tap third terminal 208 in FIG. 2A above. Returning to FIG. 4, the structure of the transformer device results in a first isolation region 400 and a second isolation region 402, which allows for an increased isolation performance (e.g., doubled) as compared with using a single transformer.

Figure 5:
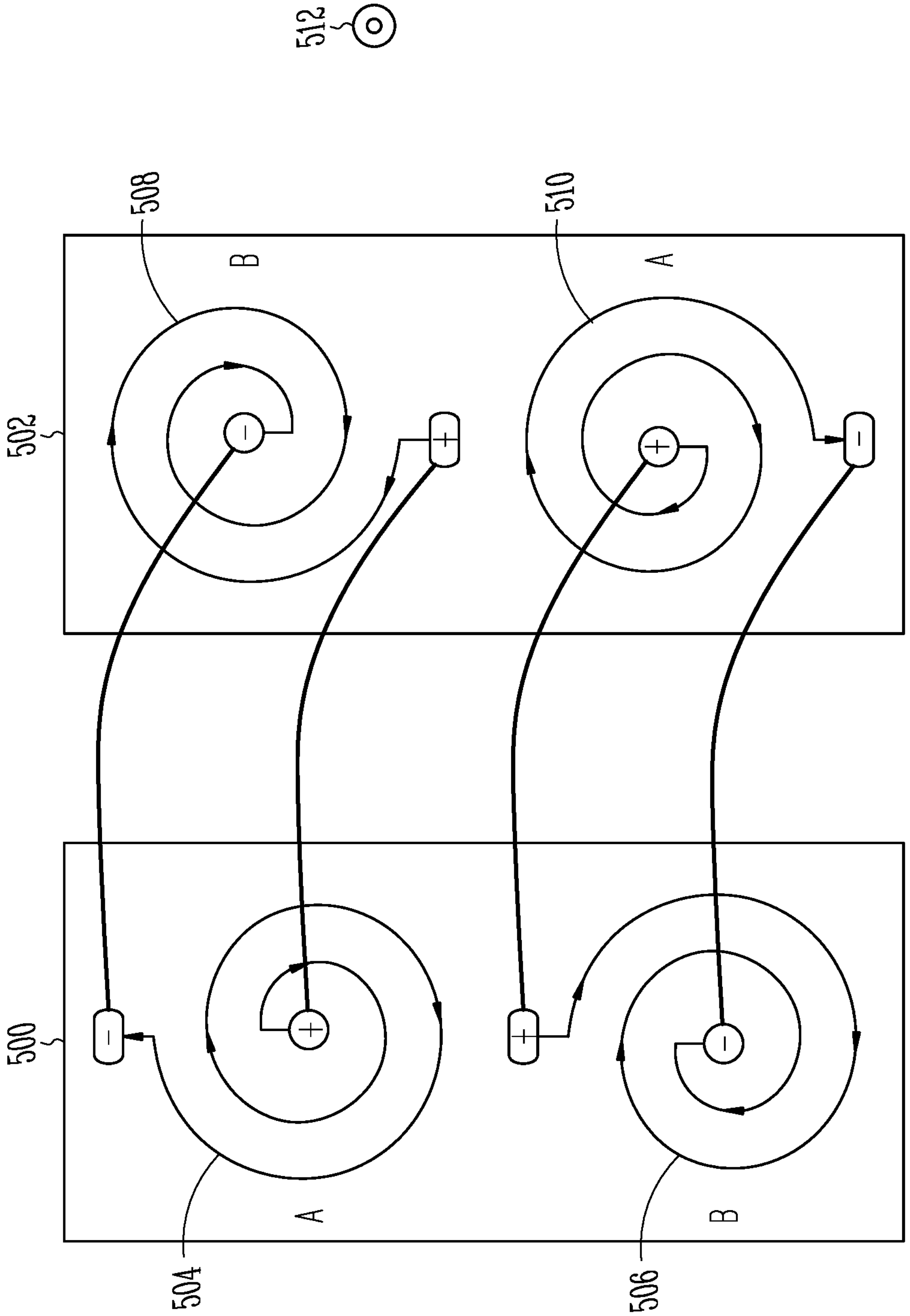
FIG. 5 illustrates the windings of the top coils of four transformers included on two integrated circuit dies.

FIG. 5 illustrates the windings of the top coils of four transformers included on two integrated circuit dice or chips. As illustrated in FIG. 5, a first integrated circuit die 500 can include a first transformer 504 and a third transformer 506. Similarly, a second integrated circuit die 502 can include a second transformer 508 connected in series with the first transformer 504 and a fourth transformer 510 connected in series with the third transformer 506. The first integrated circuit die 500 and the second integrated circuit die 502 can be located adjacent to each other (e.g., next to each other, side-by-side, etc.) and separated by a distance such as 750 micrometers (μm), or any desired or suitable distance. FIG. 5 illustrates just the top coils of the first transformer 504, the third transformer 506, the second transformer 508, and the fourth transformer 510. The transformers 504-510 can, however, be fabricated on the first integrated circuit die 500 and the second integrated circuit die 502 to include the components such as the bottom coils and circuit components located beneath the bottom coils as has been discussed above.

In an example, the top coil of the first transformer 504 and the top coil of the fourth transformer 510 can be wound in a clockwise direction, and the top coil of the third transformer 506 and the top coil of the second transformer 508 can be wound in a counter-clockwise direction. When placed in an external magnetic field 512 (with magnetic field flux lines generally in a direction out from the page or screen upon which FIG. 5 is viewed) a current induced by the series connected top coils (e.g., the top coils of the first transformer 504 and the second transformer 508 or the top spiral of the third transformer 506 and the top spiral of the fourth transformer 510) can produce a magnetic field opposing the external magnetic field. The potential across the top coil of the first transformer 504 can be different than the potential across the top coil second transformer 508 because of the different winding directions of the coil. This is also true of the potential across the top coil of the third transformer 506 and the top coil of the fourth transformer 510. This clockwise and counter-clockwise combination of windings, similar to two batteries in parallel, will not produce a current loop (due to the external magnetic field) and noise from one winding can be reduced or canceled by the other winding. As such, the configuration can reduce or cancel far field radiation and can provide increased or greater noise cancellation.

Figure 6:
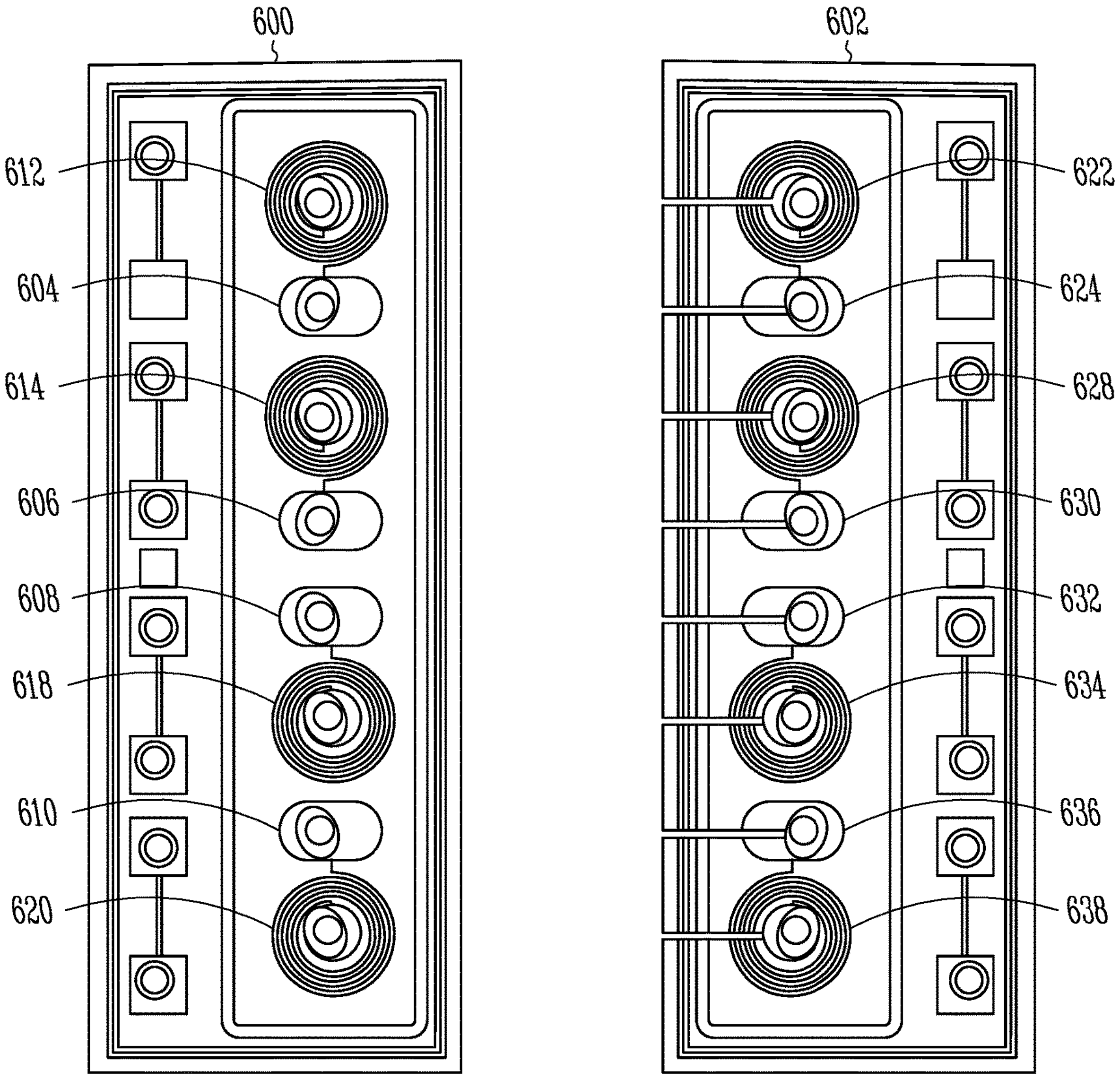
FIG. 6 illustrates an example pair of integrated circuits with eight total transformers in different configurations.

FIG. 6 illustrates an example pair of integrated circuits with eight total transformers in different configurations. As illustrated in FIG. 6, a first integrated circuit die 600 can include four transformers, and a second integrated circuit die 602 can include four transformer. While the top coils of the transformers are shown, the transformers can be fabricated on the first integrated circuit die 600 and the second integrated circuit die 602 to include the components such as the bottom coils and circuit components located beneath the bottom coils as has been discussed above. A first transformer 612 located on the first integrated circuit die 600 can be connected to a second transformer 622 located on the second integrated circuit die 602. The first integrated circuit die 600 can further include a third transformer 614, a fifth transformer 618, and a seventh transformer 620. The second integrated circuit die 602 can further include a fourth transformer 628, a sixth transformer 634, and an eighth transformer 638. The top coils of each of the transformers can be wound either in a clockwise or a counter-clockwise direction as discussed above for FIG. 5.

The transformers can also be oriented on the integrated circuit dies such that the outer pads of each transformer can be located above or below the spiral of the top coil when looking at the integrated circuit dies from above. For example, the first outer pad 604 of the first transformer 612 can be oriented or located below the spiral of the top coil of the first transformer 612. Similarly, the third outer pad 606 of the third transformer 614 can be located below the spiral of the top coil of the third transformer 614. When the outer pad is located below the spiral of the top coil of the transformer, it can be defined as being in a "down" position. Conversely, the fifth outer pad 608 of the fifth transformer 618 and the seventh outer pad 610 of the seventh transformer 620 can be oriented or located above the spirals of the top coils of the fifth transformer 618 and the seventh transformer 620. This configuration can be defined as being an "up" position.

Thus, the transformers on the first integrated circuit die 600 being arranged in an "down-down, up-up" configuration with respect to the location or orientation of their outer pads. Whether the outer pad of a particular transformer is in the up configuration, or the down configuration can depend, in part, on whether the top coil of the particular transformer is wound in a clockwise direction or a counter-clockwise direction. This configuration of the outer pads can be repeated such as is illustrated by the configuration of the outer pads on the transformers on the second integrated circuit die 602 in which the second outer pad 624 of the second transformer 622 and the fourth outer pad 630 of the fourth transformer 628 are located in the "down" position, and the sixth outer pad 632 of the sixth transformer 634 and the eighth outer pad 636 of the eighth transformer 638 can be in the "up" position. While both the first integrated circuit die 600 and the second integrated circuit die 602 orient the transformers in the down-down, up-up configuration, any integrated circuit die including four transformers can have a down-down, up-up configuration, an up-up, down-down configuration, an up-down, up-down configuration, or any configuration desired. Similarly, each integrated circuit die can contain any number of transformers oriented in any configuration desired or appropriate for a circuit, device, or the like, in which the transformers are to be used or to be connected.

Figure 7:
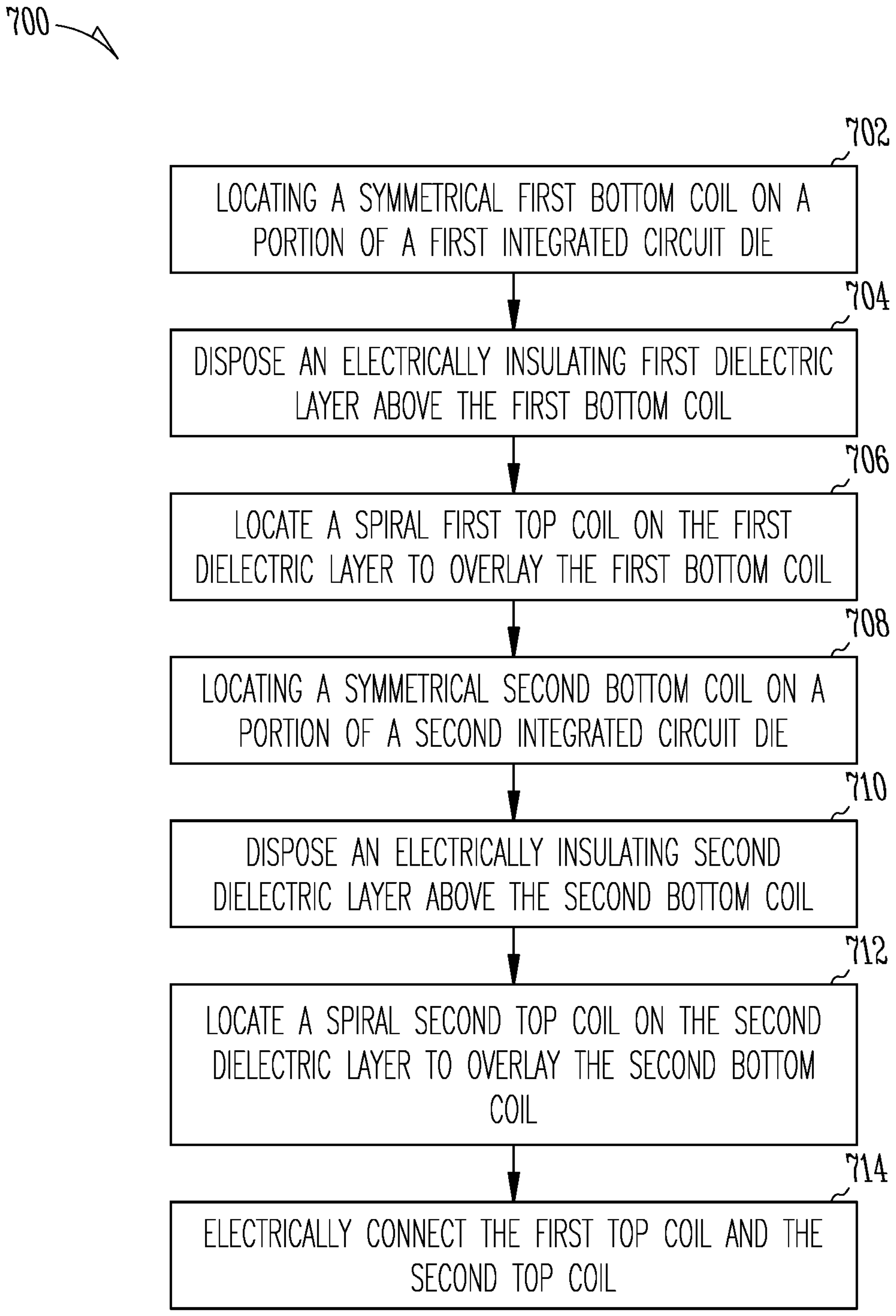
FIG. 7 illustrates an example of a method for fabricating a monolithic or multi-die transformer device.

FIG. 7 illustrates an example of a method 700 for fabricating a monolithic or multi-die transformer device. Operation 702 can include locating a symmetrical first bottom coil on a portion of a first integrated circuit die. The first bottom coil can be fabricated using a Top Thick Metal (Mtop) of a CMOS back-end process. This can involve fabricating the bottom coil using layers of metal. The first bottom coil can include electrically conductive crossovers between individual windings of pairs of adjacent windings. The first bottom coil can further include first and second differential terminals and a first center tap third terminal electrically connected to an inner-most winding of the first bottom coil. In an example, a first metal layer can be used for the electrically conductive crossovers. The first metal layer may comprise at least one of silver, copper, gold, aluminum, or any desirable and/or suitable metals or metal alloys, and a second metal layer can be used for an underpass connection to the center tap, to connect the first center tap third terminal to the inner-most winding of the first bottom coil. The second metal layer can comprise the same type of metal as the first metal layer or a different type of metal, as desired Operation 704 can include disposing an electrically insulating first dielectric layer above the first bottom coil. The dielectric can be a polyimide or another dielectric such as a silicon dioxide or silicon nitride dielectric available in a CMOS process or any other suitable material with dielectric insulating properties. such as can be suitable for insulating and protecting the windings of the coil, or to act or perform as an insulating and/or passivation layer. Operation 706 can include locating a spiral first top coil on (e.g., above, on top of, or the like) the first dielectric layer to overlay the first bottom coil. The first top coil can be electrically connected to an encompassed first inner pad and a laterally offset first outer pad. The first inner pad, the first outer pad, and the first top coil can include a shared first electrically conductive integrated circuit layer of the first integrated circuit die. In an example, the electrically insulating first dielectric layer can separate at least a portion of the first top coil and the first bottom coil. The insulating layer can further include or be superjacent to an embedded conductive pad shield located below, underneath, or the like, the first outer pad, which can optionally be connected to ground. The shield can be an additional metal layer (e.g., a third metal layer) that can prevent electromagnetic interference from the windings of the top coil, and by grounding the shield, noise signals can be sent to ground and prevented from interfering in the circuit or device to which the transformer is connected to or powering.

Operation 708 can include locating a symmetrical second bottom coil on a portion of a second integrated circuit die, Operation 710 can include disposing an electrically insulating second dielectric layer above the second bottom coil, and Operation 712 can include locating a spiral second top coil in the second dielectric layer to overlay the second bottom coil. In an example, Operations 708-712 can be performed on the second integrated circuit die using the same or a similar process as described for Operations 702-706. In an example, the first integrated circuit die, and the second integrated circuit die can be located adjacent to or next to each other and be separated by a distance such as 750 μm.

Operation 714 can include electrically connecting the first top coil and the second top coil. The top coils of the first transformer and the second transformer can be connected in series, such as by using bond wires to connect the pads of the top coil of the first transformer to the pads of the top coil of the second transformer. For example, the first outer pad can be connected to the second inner pad and the first inner pad can be connected to the second outer pad. In another example, the first outer pad can be connected to the second outer pad and the first inner pad connected to the second inner pad. Thus, the pads of the first transformer can be electrically connected to the pads of the second transformer in any configuration desired.

The pad connections between the first and second transformer can be based at least in part on the winding directions of the top coils of the first and second transformers. In an example, the top coil of the first transformer can be wound in a clockwise direction and the top coil of the second transformer can be wound in a counter-clockwise direction. Alternatively, the top coil of the first transformer can be wound in a counter-clockwise direction and the top coil of the second transformer can be wound in a clockwise direction. The winding directions of the coils can be based on the external magnetic field in which the transformers are placed, and the coils of each transformer can be wound in such a way as to induce a current that can produce a magnetic field opposite to the external magnetic field. This effect can result in greater or improved noise cancellation.

The above detailed description includes references to the accompanying drawings, which form a part of the detailed description. The drawings show, by way of illustration, specific embodiments that may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

ADDITIONAL NOTES AND EXAMPLES

Example 1 is a fully symmetrical and balanced monolithic or multi-die integrated circuit transformer device comprising: a first transformer, including: a symmetrical first bottom coil including electrically conductive crossovers between individual windings of pairs of adjacent windings, the first bottom coil including first and second differential terminals and also including a first center tap third terminal electrically connected to an inner-most winding of the first bottom coil; and a spiral first top coil, electrically connected to an encompassed first inner pad and a laterally offset first outer pad, the first top coil, the first inner pad, and the first outer pad including a shared first electrically conductive integrated circuit layer; and wherein the first top coil and the first bottom coil are overlaid and are separated from each other by an electrically insulating first dielectric layer; a second transformer, electrically in series with the first transformer, the second transformer including: a symmetrical second bottom coil including electrically conductive crossovers between individual windings of pairs of adjacent windings, the second bottom coil including third and fourth differential terminals and also including a second center tap third terminal electrically connected to an inner-most winding of the second bottom coil; and a spiral second top coil, electrically connected to an encompassed second inner pad and a laterally offset second outer pad, the second top coil, the second inner pad, and the second outer pad including a shared second electrically conductive integrated circuit layer; and wherein the second top coil and the second bottom coil are overlaid and are separated from each other by the electrically insulating first dielectric layer.

In Example 2, the subject matter of Example 1 optionally includes wherein the first outer pad is electrically connected to the second inner pad and wherein the first inner pad is electrically connected to the second outer pad.

In Example 3, the subject matter of any one or more of Examples 1-2 optionally include wherein the first outer pad is electrically connected to the second outer pad and wherein the first inner pad is electrically connected to the second inner pad.

In Example 4, the subject matter of any one or more of Examples 1-3 optionally include a first ground shield located beneath the first outer pad of the first transformer; and a second ground shield located beneath the second outer pad of the second transformer.

In Example 5, the subject matter of any one or more of Examples 1~4 optionally include a circuit component located below at least one of the bottom coil of the first transformer or the bottom coil of the second transformer, wherein the circuit component includes at least one of a capacitor, an active component included in transmitter circuitry, or an active component included in receiver circuitry.

In Example 6, the subject matter of any one or more of Examples 1-5 optionally include wherein the top coil of the first transformer is wound in a clockwise direction, and, wherein the top coil of the second transformer is wound in a counter-clockwise direction.

In Example 7, the subject matter of any one or more of Examples 1-6 optionally include a third transformer, including: a symmetrical third bottom coil including electrically conductive crossovers between individual windings of pairs of adjacent windings, the third bottom coil including fifth and sixth differential terminals and also including a third center tap third terminal electrically connected to an inner-most winding of the third bottom coil; and a spiral third top coil, electrically connected to an encompassed third inner pad and a laterally offset third outer pad, the third top coil, the third inner pad, and the third outer pad including a shared third electrically conductive integrated circuit layer; and wherein the third top coil and the third bottom coil are overlaid and are separated from each other by an electrically insulating third dielectric layer; a fourth transformer, in series with the third transformer, the fourth transformer including: a symmetrical fourth bottom coil including electrically conductive crossovers between individual windings of pairs of adjacent windings, the fourth bottom coil including seventh and eighth differential terminals and also including a fourth center tap third terminal electrically connected to an inner-most winding of the fourth bottom coil; and a spiral fourth top coil, electrically connected to an encompassed fourth inner pad and a laterally offset fourth outer pad, the fourth top coil, the fourth inner pad, and the fourth outer pad including a shared fourth electrically conductive integrated circuit layer; and wherein the fourth top coil and the fourth bottom coil are overlaid and are separated from each other by an electrically insulating fourth dielectric layer.

In Example 8, the subject matter of Example 7 optionally includes wherein the first transformer and the third transformer are located on a first integrated circuit die, wherein the second transformer and the fourth transformer are located on a second integrated circuit die located adjacent to the first integrated circuit die.

In Example 9, the subject matter of any one or more of Examples 7-8 optionally include wherein the top coil of the third transformer is wound in a counter-clockwise direction, and wherein the top coil of the fourth transformer is wound in a clockwise direction.

Example 10 is a fully symmetrical and balanced monolithic or multi-die integrated circuit transformer device comprising: a first transformer, including: a symmetrical first bottom coil including electrically conductive crossovers between individual windings of pairs of adjacent windings, the first bottom coil including first and second differential terminals and also including a first center tap third terminal electrically connected to an inner-most winding of the first bottom coil; and a spiral first top coil, electrically connected to an encompassed first inner pad and a laterally offset first outer pad, the first top coil, the first inner pad, and the first outer pad including a shared first electrically conductive integrated circuit layer; and wherein the first top coil and the first bottom coil are overlaid and are separated from each other by an electrically insulating first dielectric layer; a second transformer, electrically in series with the first transformer, the second transformer including: a symmetrical second bottom coil including electrically conductive crossovers between individual windings of pairs of adjacent windings, the second bottom coil including third and fourth differential terminals and also including a second center tap third terminal electrically connected to an inner-most winding of the second bottom coil; and a spiral second top coil, electrically connected to an encompassed second inner pad and a laterally offset second outer pad, the second top coil, the second inner pad, and the second outer pad including a shared second electrically conductive integrated circuit layer; wherein the second top coil and the second bottom coil are overlaid and are separated from each other by the electrically insulating first dielectric layer; and a circuit component located below at least one of the bottom coil of the first transformer or the bottom coil of the second transformer.

In Example 11, the subject matter of Example 10 optionally includes wherein the circuit component includes a capacitor.

In Example 12, the subject matter of any one or more of Examples 10-11 optionally include wherein the circuit component includes a transmitter circuitry.

In Example 13, the subject matter of any one or more of Examples 10-12 optionally include wherein the circuit component includes a receiver circuitry.

In Example 14, the subject matter of any one or more of Examples 10-13 optionally include wherein the first transformer is located on a first integrated circuit die and the second transformer is located on a second integrated circuit die located adjacent to the first integrated circuit die.

In Example 15, the subject matter of any one or more of Examples 10-14 optionally include wherein the top coil of the first transformer is wound in a clockwise direction, and, wherein the top coil of the second transformer is wound in a counter-clockwise direction.

Example 16 is a fully symmetrical and balanced monolithic or multi-die integrated circuit transformer device comprising: a first transformer, including: a symmetrical first bottom coil including electrically conductive crossovers between individual windings of pairs of adjacent windings, the first bottom coil including first and second differential terminals and also including a first center tap third terminal electrically connected to an inner-most winding of the first bottom coil; and a spiral first top coil, electrically connected to an encompassed first inner pad and a laterally offset first outer pad, the first top coil, the first inner pad, and the first outer pad including a shared first electrically conductive integrated circuit layer; and wherein the first top coil and the first bottom coil are overlaid and are separated from each other by an electrically insulating first dielectric layer; a second transformer, electrically in series with the first transformer, the second transformer including: a symmetrical second bottom coil including electrically conductive crossovers between individual windings of pairs of adjacent windings, the second bottom coil including third and fourth differential terminals and also including a second center tap third terminal electrically connected to an inner-most winding of the second bottom coil; and a spiral second top coil, electrically connected to an encompassed second inner pad and a laterally offset second outer pad, the second top coil, the second inner pad, and the second outer pad including a shared second electrically conductive integrated circuit layer; wherein the second top coil and the second bottom coil are overlaid and are separated from each other by the electrically insulating first dielectric layer; a third transformer, including: a symmetrical third bottom coil including electrically conductive crossovers between individual windings of pairs of adjacent windings, the third bottom coil including fifth and sixth differential terminals and also including a third center tap third terminal electrically connected to an inner-most winding of the third bottom coil; and a spiral third top coil, electrically connected to an encompassed third inner pad and a laterally offset third outer pad, the third top coil, the third inner pad, and the third outer pad including a shared third electrically conductive integrated circuit layer; and wherein the third top coil and the third bottom coil are overlaid and are separated from each other by an electrically insulating third dielectric layer; a fourth transformer, electrically in series with the third transformer, the fourth transformer including: a symmetrical fourth bottom coil including electrically conductive crossovers between individual windings of pairs of adjacent windings, the fourth bottom coil including seventh and eighth differential terminals and also including a fourth center tap third terminal electrically connected to an inner-most winding of the fourth bottom coil; and a spiral fourth top coil, electrically connected to an encompassed fourth inner pad and a laterally offset fourth outer pad, the fourth top coil, the fourth inner pad, and the fourth outer pad including a shared fourth electrically conductive integrated circuit layer; and wherein the fourth top coil and the fourth bottom coil are overlaid and are separated from each other by an electrically insulating fourth dielectric layer.

In Example 17, the subject matter of Example 16 optionally includes wherein the first outer pad is electrically connected to the second inner pad and wherein the first inner pad is electrically connected to the second outer pad.

In Example 18, the subject matter of any one or more of Examples 16-17 optionally include wherein the first outer pad is electrically connected to the second outer pad and wherein the first inner pad is electrically connected to the second inner pad.

In Example 19, the subject matter of any one or more of Examples 16-18 optionally include wherein the third outer pad is electrically connected to the fourth inner pad and wherein the third inner pad is electrically connected to the fourth outer pad.

In Example 20, the subject matter of any one or more of Examples 16-19 optionally include wherein the third outer pad is electrically connected to the fourth outer pad and wherein the third inner pad is electrically connected to the fourth inner pad.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is to allow the reader to quickly ascertain the nature of the technical disclosure and is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the embodiments should be determined with reference to the appended claims, along with the full scope of equivalents to which such claims are entitled.

What is claimed is:

1. A fully symmetrical and balanced monolithic or multi-die integrated circuit transformer device comprising:

a first transformer, including:

a symmetrical first bottom coil including electrically conductive crossovers between individual windings of pairs of adjacent windings, the first bottom coil including first and second differential terminals and also including a first center tap third terminal electrically connected to an inner-most winding of the first bottom coil; and a spiral first top coil, electrically connected to an encompassed first inner pad and a laterally offset first outer pad, the first top coil, the first inner pad, and the first outer pad including a shared first electrically conductive integrated circuit layer; and wherein the first top coil and the first bottom coil are overlaid and are separated from each other by an electrically insulating first dielectric layer;

a second transformer, electrically in series with the first transformer, the second transformer including:

a symmetrical second bottom coil including electrically conductive crossovers between individual windings of pairs of adjacent windings, the second bottom coil including third and fourth differential terminals and also including a second center tap third terminal electrically connected to an inner-most winding of the second bottom coil; and a spiral second top coil, electrically connected to an encompassed second inner pad and a laterally offset second outer pad, the second top coil, the second inner pad, and the second outer pad including a shared second electrically conductive integrated circuit layer; and wherein the second top coil and the second bottom coil are overlaid and are separated from each other by the electrically insulating first dielectric layer.

2. The transformer device of claim 1, wherein the first outer pad is electrically connected to the second inner pad and wherein the first inner pad is electrically connected to the second outer pad.

3. The transformer device of claim 1, wherein the first outer pad is electrically connected to the second outer pad and wherein the first inner pad is electrically connected to the second inner pad.

4. The transformer device of claim 1, further comprising:

a first ground shield located beneath the first outer pad of the first transformer; and a second ground shield located beneath the second outer pad of the second transformer.

5. The transformer device of claim 1, further comprising:

a circuit component located below at least one of the bottom coil of the first transformer or the bottom coil of the second transformer, wherein the circuit component includes at least one of a capacitor, an active component included in transmitter circuitry, or an active component included in receiver circuitry.

6. The transformer device of claim 1, wherein the top coil of the first transformer is wound in a clockwise direction, and, wherein the top coil of the second transformer is wound in a counter-clockwise direction.

7. The transformer device of claim 1, further comprising:

a third transformer, including:

a symmetrical third bottom coil including electrically conductive crossovers between individual windings of pairs of adjacent windings, the third bottom coil including fifth and sixth differential terminals and also including a third center tap third terminal electrically connected to an inner-most winding of the third bottom coil; and a spiral third top coil, electrically connected to an encompassed third inner pad and a laterally offset third outer pad, the third top coil, the third inner pad, and the third outer pad including a shared third electrically conductive integrated circuit layer; and wherein the third top coil and the third bottom coil are overlaid and are separated from each other by an electrically insulating third dielectric layer;

a fourth transformer, in series with the third transformer, the fourth transformer including:

a symmetrical fourth bottom coil including electrically conductive crossovers between individual windings of pairs of adjacent windings, the fourth bottom coil including seventh and eighth differential terminals and also including a fourth center tap third terminal electrically connected to an inner-most winding of the fourth bottom coil; and a spiral fourth top coil, electrically connected to an encompassed fourth inner pad and a laterally offset fourth outer pad, the fourth top coil, the fourth inner pad, and the fourth outer pad including a shared fourth electrically conductive integrated circuit layer; and wherein the fourth top coil and the fourth bottom coil are overlaid and are separated from each other by an electrically insulating fourth dielectric layer.

8. The transformer device of claim 7, wherein the first transformer and the third transformer are located on a first integrated circuit die, wherein the second transformer and the fourth transformer are located on a second integrated circuit die located adjacent to the first integrated circuit die.

9. The transformer device of claim 7, wherein the top coil of the third transformer is wound in a counter-clockwise direction, and wherein the top coil of the fourth transformer is wound in a clockwise direction.

10. A fully symmetrical and balanced monolithic or multi-die integrated circuit transformer device comprising:

a first transformer, including:

a symmetrical first bottom coil including electrically conductive crossovers between individual windings of pairs of adjacent windings, the first bottom coil including first and second differential terminals and also including a first center tap third terminal electrically connected to an inner-most winding of the first bottom coil; and a spiral first top coil, electrically connected to an encompassed first inner pad and a laterally offset first outer pad, the first top coil, the first inner pad, and the first outer pad including a shared first electrically conductive integrated circuit layer; and wherein the first top coil and the first bottom coil are overlaid and are separated from each other by an electrically insulating first dielectric layer;

a second transformer, electrically in series with the first transformer, the second transformer including:

a symmetrical second bottom coil including electrically conductive crossovers between individual windings of pairs of adjacent windings, the second bottom coil including third and fourth differential terminals and also including a second center tap third terminal electrically connected to an inner-most winding of the second bottom coil; and a spiral second top coil, electrically connected to an encompassed second inner pad and a laterally offset second outer pad, the second top coil, the second inner pad, and the second outer pad including a shared second electrically conductive integrated circuit layer;

wherein the second top coil and the second bottom coil are overlaid and are separated from each other by the electrically insulating first dielectric layer; and a circuit component located below at least one of the bottom coil of the first transformer or the bottom coil of the second transformer.

11. The transformer device of claim 10, wherein the circuit component includes a capacitor.

12. The transformer device of claim 10, wherein the circuit component includes a transmitter circuitry.

13. The transformer device of claim 10, wherein the circuit component includes a receiver circuitry.

14. The transformer device of claim 10, wherein the first transformer is located on a first integrated circuit die and the second transformer is located on a second integrated circuit die located adjacent to the first integrated circuit die.

15. The transformer device of claim 10, wherein the top coil of the first transformer is wound in a clockwise direction, and, wherein the top coil of the second transformer is wound in a counter-clockwise direction.

16. A fully symmetrical and balanced monolithic or multi-die integrated circuit transformer device comprising:

a first transformer, including:

a symmetrical first bottom coil including electrically conductive crossovers between individual windings of pairs of adjacent windings, the first bottom coil including first and second differential terminals and also including a first center tap third terminal electrically connected to an inner-most winding of the first bottom coil; and a spiral first top coil, electrically connected to an encompassed first inner pad and a laterally offset first outer pad, the first top coil, the first inner pad, and the first outer pad including a shared first electrically conductive integrated circuit layer; and wherein the first top coil and the first bottom coil are overlaid and are separated from each other by an electrically insulating first dielectric layer;

a second transformer, electrically in series with the first transformer, the second transformer including:

a symmetrical second bottom coil including electrically conductive crossovers between individual windings of pairs of adjacent windings, the second bottom coil including third and fourth differential terminals and also including a second center tap third terminal electrically connected to an inner-most winding of the second bottom coil; and a spiral second top coil, electrically connected to an encompassed second inner pad and a laterally offset second outer pad, the second top coil, the second inner pad, and the second outer pad including a shared second electrically conductive integrated circuit layer;

wherein the second top coil and the second bottom coil are overlaid and are separated from each other by the electrically insulating first dielectric layer;

a third transformer, including:

a symmetrical third bottom coil including electrically conductive crossovers between individual windings of pairs of adjacent windings, the third bottom coil including fifth and sixth differential terminals and also including a third center tap third terminal electrically connected to an inner-most winding of the third bottom coil; and a spiral third top coil, electrically connected to an encompassed third inner pad and a laterally offset third outer pad, the third top coil, the third inner pad, and the third outer pad including a shared third electrically conductive integrated circuit layer; and wherein the third top coil and the third bottom coil are overlaid and are separated from each other by an electrically insulating third dielectric layer;

a fourth transformer, electrically in series with the third transformer, the fourth transformer including:

a symmetrical fourth bottom coil including electrically conductive crossovers between individual windings of pairs of adjacent windings, the fourth bottom coil including seventh and eighth differential terminals and also including a fourth center tap third terminal electrically connected to an inner-most winding of the fourth bottom coil; and a spiral fourth top coil, electrically connected to an encompassed fourth inner pad and a laterally offset fourth outer pad, the fourth top coil, the fourth inner pad, and the fourth outer pad including a shared fourth electrically conductive integrated circuit layer; and wherein the fourth top coil and the fourth bottom coil are overlaid and are separated from each other by an electrically insulating fourth dielectric layer.

17. The transformer device of claim 16, wherein the first outer pad is electrically connected to the second inner pad and wherein the first inner pad is electrically connected to the second outer pad.

18. The transformer device of claim 16, wherein the first outer pad is electrically connected to the second outer pad and wherein the first inner pad is electrically connected to the second inner pad.

19. The transformer device of claim 16, wherein the third outer pad is electrically connected to the fourth inner pad and wherein the third inner pad is electrically connected to the fourth outer pad.

20. The transformer device of claim 16, wherein the third outer pad is electrically connected to the fourth outer pad and wherein the third inner pad is electrically connected to the fourth inner pad.

* * * * *